United States Patent
Watanabe (12)

(10) Patent No.: US 6,373,134 B1
(45) Date of Patent: Apr. 16, 2002

(54) SEMICONDUCTOR DEVICE AND FABRICATION METHOD INTRODUCING HORIZONTAL SIDE-STEPS INTO VERTICAL STEPS

(75) Inventor: Fumio Watanabe, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/514,030

(22) Filed: Feb. 25, 2000

(30) Foreign Application Priority Data

Mar. 1, 1999 (JP) .......................... 11-052763

(51) Int. Cl.[7] .......................... H01L 23/48; H01L 23/52
(52) U.S. Cl. .......................... 257/734; 257/736; 257/775; 257/435; 257/760
(58) Field of Search .......................... 257/730, 736, 257/775, 750, 758, 760, 91, 99, 249, 431, 432, 435

(56) References Cited

U.S. PATENT DOCUMENTS

| | | | | |
|---|---|---|---|---|
| 3,728,593 A | * | 4/1973 | Coleman | 317/234 |
| 4,376,285 A | * | 3/1983 | Leonberger et al. | 257/439 |
| 5,032,879 A | * | 7/1991 | Buchmann et al. | 257/466 |
| 5,703,895 A | * | 12/1997 | Ghirardi et al. | 372/50 |
| 5,815,615 A | * | 9/1998 | Taneya et al. | 385/50 |
| 6,146,229 A | * | 11/2000 | Smith et al. | 445/46 |
| 6,172,414 B1 | * | 1/2001 | Tran et al. | 257/678 |

* cited by examiner

Primary Examiner—Jhihan B Clark
(74) Attorney, Agent, or Firm—Akin, Gump, Strauss, Hauer & Feld, L.L.P.

(57) ABSTRACT

A semiconductor device has an interconnection pattern that crosses a vertical step. The part of the vertical step crossed by the interconnection pattern includes a horizontal side-step. The horizontal side-step increases the total length of the crossing, thereby reducing the risk of electrical discontinuity at the crossing, without increasing the width of the interconnection pattern itself.

8 Claims, 7 Drawing Sheets

SEMICONDUCTOR DEVICE AND FABRICATION METHOD INTRODUCING HORIZONTAL SIDE-STEPS INTO VERTICAL STEPS

BACKGROUND OF THE INVENTION

The present invention relates to a semiconductor device having a surface on which interconnection wiring passes over a vertical step.

Semiconductor devices are generally fabricated in the surface layers of a semiconductor wafer. Interconnection wiring is formed by coating the entire surface of the wafer with a thin metal film, then etching the film to remove unwanted metal, leaving the desired wiring pattern.

A problem in this process is that the wafer surface is generally not flat; the interconnection pattern may have to cross one or more vertical steps. At the bottom of each vertical step, there tends to be a small gap between the wafer surface and the deposited metal film. When the film is etched, the etchant can easily enter the gap and etch the metal from underneath, enlarging the gap into a sizeable tunnel that greatly reduces the thickness of the film on the vertical face of the step. Combined with subsequent joule heating or electromigration, such tunnels can create open circuits in the interconnection pattern, leading to device failure.

The thickness of the metal film on the vertical face of a step, or the ratio of this thickness to the thickness of the metal film on flat horizontal parts of the surface, is generally referred to as the step coverage.

One solution to the step-coverage problem is to increase the width of the interconnection wiring pattern wherever there is a vertical step. If the pattern is made wide enough, etchant tunneling under an interconnecting wire from the edges will be unable to reach the central part of the wire, which will remain intact. This solution is unsatisfactory, however, because wide interconnection patterns are incompatible e with high integration density.

SUMMARY OF THE INVENTION

An object of the present invention is to enable interconnection patterns to cross vertical steps without risk of electrical discontinuity, and without increasing the pattern width.

A semiconductor device according to the present invention has an electrode formation surface with a vertical step including at least one horizontal side-step. An interconnection pattern is formed on the electrode formation surface, crossing the vertical step, entirely covering the horizontal side-step.

The horizontal side-step reduces the risk of electrical discontinuity in the interconnection pattern by increasing the total length of the part of the vertical step crossed by the interconnection pattern. This increase is accomplished without an increase in the width of the interconnection pattern itself.

DETAILED DESCRIPTION OF THE INVENTION

The invention will now be described with reference to the attached drawings, in which like parts are indicated by like reference characters. As embodiments of the invention, the drawings show an array if light-emitting diodes or LEDs, and a fabrication process for the LED array.

Figure 1:
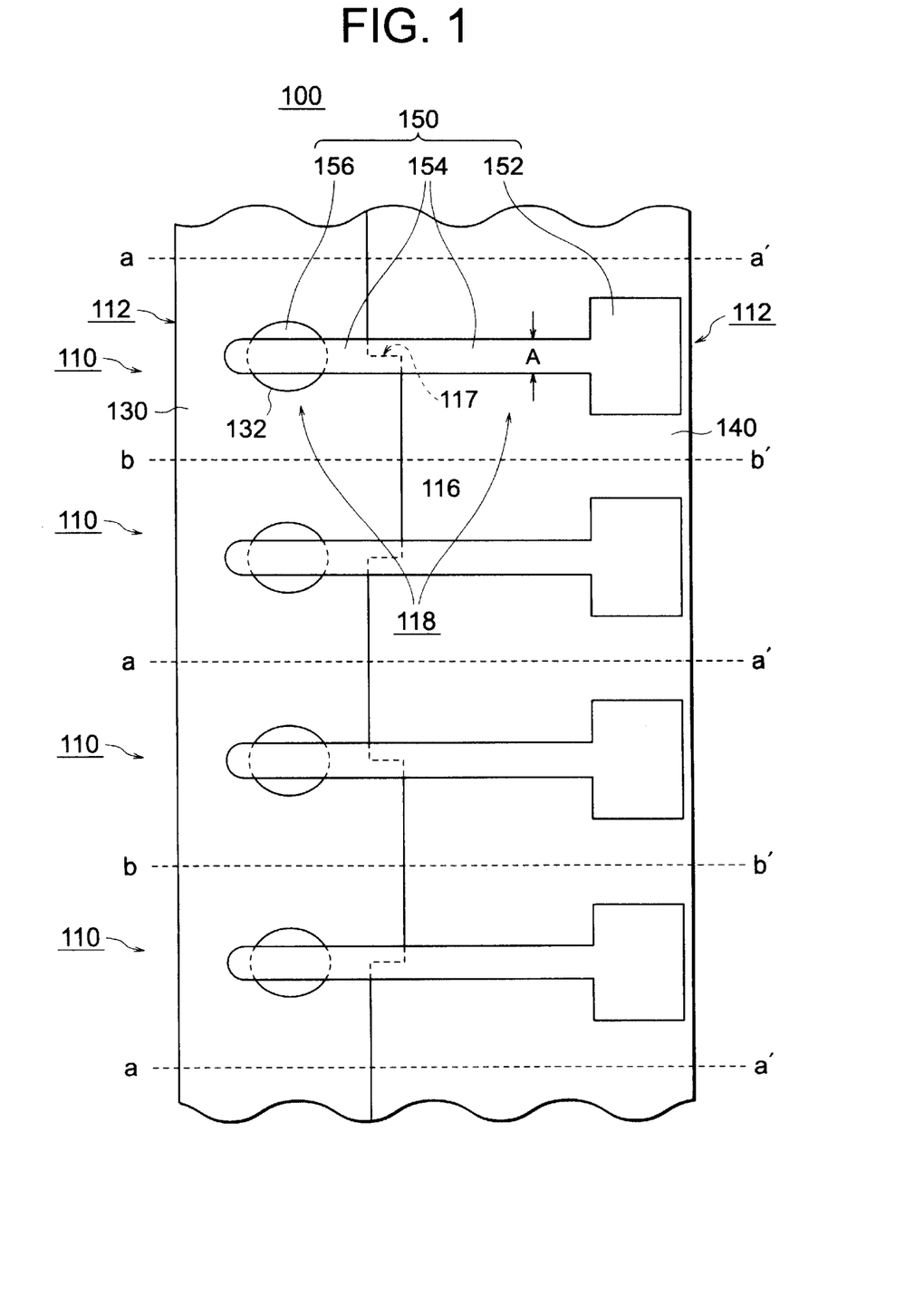
FIG. 1 is a partial plan view of a semiconductor device embodying the present invention.

Referring to FIG. 1, the LED array 100 is a linear array of the type used as a light source in the print head of an electrophotographic printer. Each LED 110 is formed in an area extending across the array from one edge 112 to the other edge 114. A vertical step 116 runs along the electrode formation surface 118 of the array, between and parallel to these edges 112, 114. Seen in plan view, the vertical step 116 is generally straight, but makes a horizontal side-step 117 in each LED 110. These side-steps are made alternately toward the first edge 112 and the second edge 114. The horizontal side-steps 117 occur at intervals corresponding to the density of the array, or to the resolution of the printer in which the array is used. Typical resolution values are three hundred, six hundred, and twelve hundred dots per inch (300 dpi, 600 dpi, 1200 dpi).

Figure 2:
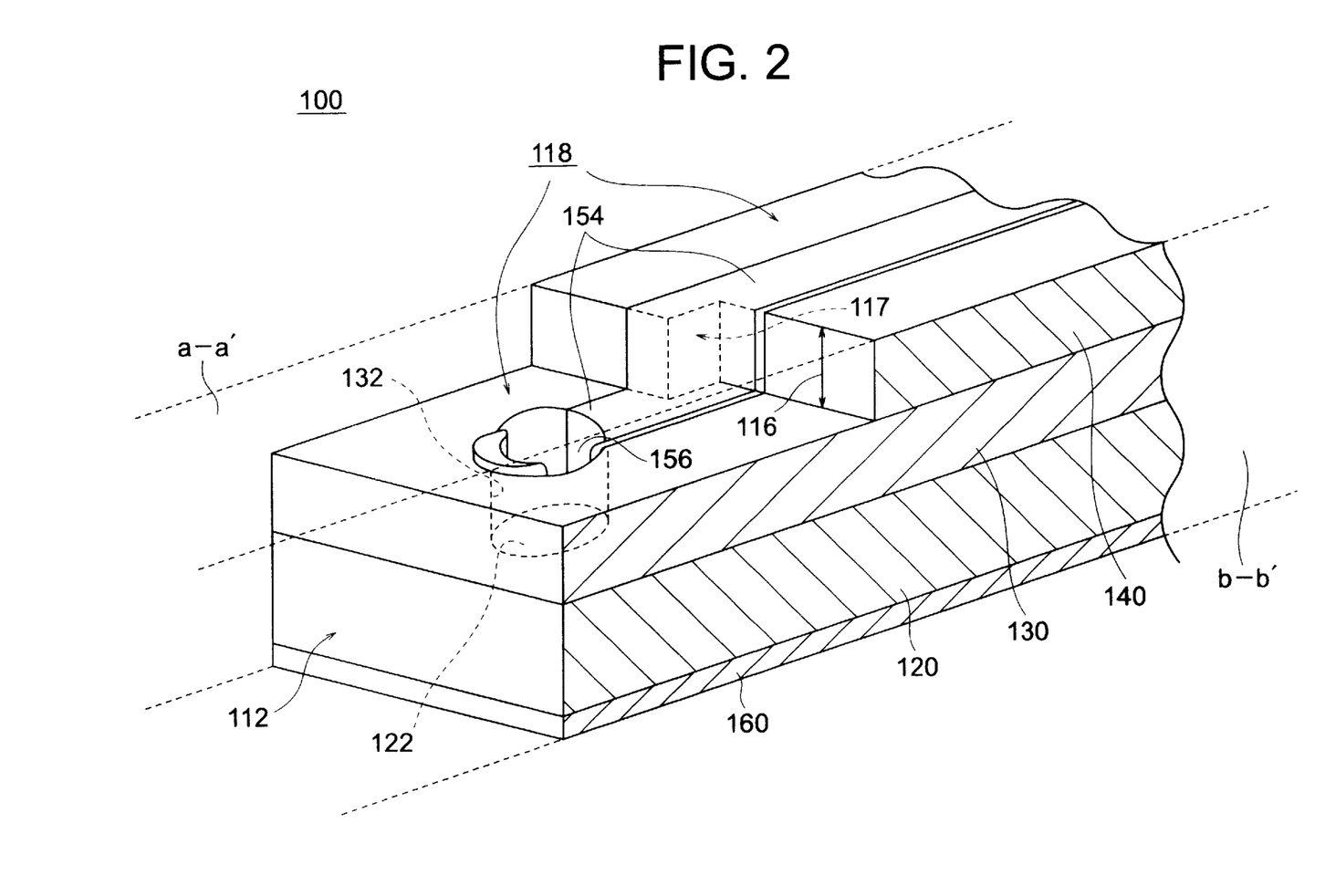
FIG. 2 is an enlarged perspective view of part of the device in FIG. 1.

Referring to FIG. 2, the LED array 100 is formed in a semiconductor substrate 120 such as a gallium arsenide phosphide (GaAsP) substrate. Each LED 110 has a light-emitting region 122 doped with an impurity element such as zinc (Zn), which is diffused into the semiconductor substrate 120 through a diffusion mask 130, forming a p-n homojunction. The diffusion mask 130 covers the entire surface of the semiconductor substrate 120, except for a window 132 formed in each LED area to admit the impurity. The window 132 is referred to below as an emitter window, because light is emitted through it. The diffusion mask 130 comprises, for example, a mixture of aluminum oxide and silicon nitride ($Al_2O_3/Si_3N_4$).

The diffusion mask 130 is partially covered by an inter-layer dielectric film 140, one edge of which forms the vertical step 116. The diffusion mask 130 and inter-layer dielectric film 140 both provide electrical isolation between the semiconductor substrate 120 and the wiring interconnection pattern to be described below. A particular function of the inter-layer dielectric film 140 is to keep pinholes in the diffusion mask 130 from creating short circuits. The inter-layer dielectric film 140 is preferably a film of a material, such as silicon nitride ($Si_3N_4$), in which pinholes do not readily form.

The edges a–a' and b–b' of the part of the array shown in FIG. 2 correspond to the imaginary lines a–a' and b–b' separating different LEDs in FIG. 1. Vertical dimensions in FIG. 2 are greatly exaggerated for clarity.

As shown in FIG. 1, the inter-layer dielectric film 140 extends from the second edge 114 of the array to the vertical step 116. The electrode formation surface 118 comprises the surface of the inter-layer dielectric film 140, the vertical step 116, and the exposed surface of the diffusion mask 130. The interconnection pattern 150 for each LED 110 comprises a bonding pad 152 disposed on the inter-layer dielectric film 140, an interconnecting trace 154 crossing the vertical step 116, and a contact portion 156 disposed in the emitter window 132. The bonding pad 152 is coupled by a bonding wire (not visible) to an external power source. The interconnecting trace 154 conducts current from the bonding pad 152 to the contact portion 156, which makes electrical contact with the light-emitting region 122 at the bottom of the emitter window 132. The interconnecting trace 154 has a constant width A. The interconnection pattern 150 comprises a metal material such as aluminum (Al).

As shown in FIG. 2, the LED array 100 also has a common electrode 160, formed on the underside of the semiconductor substrate 120, to conduct current back to the external power source.

Figure 3:
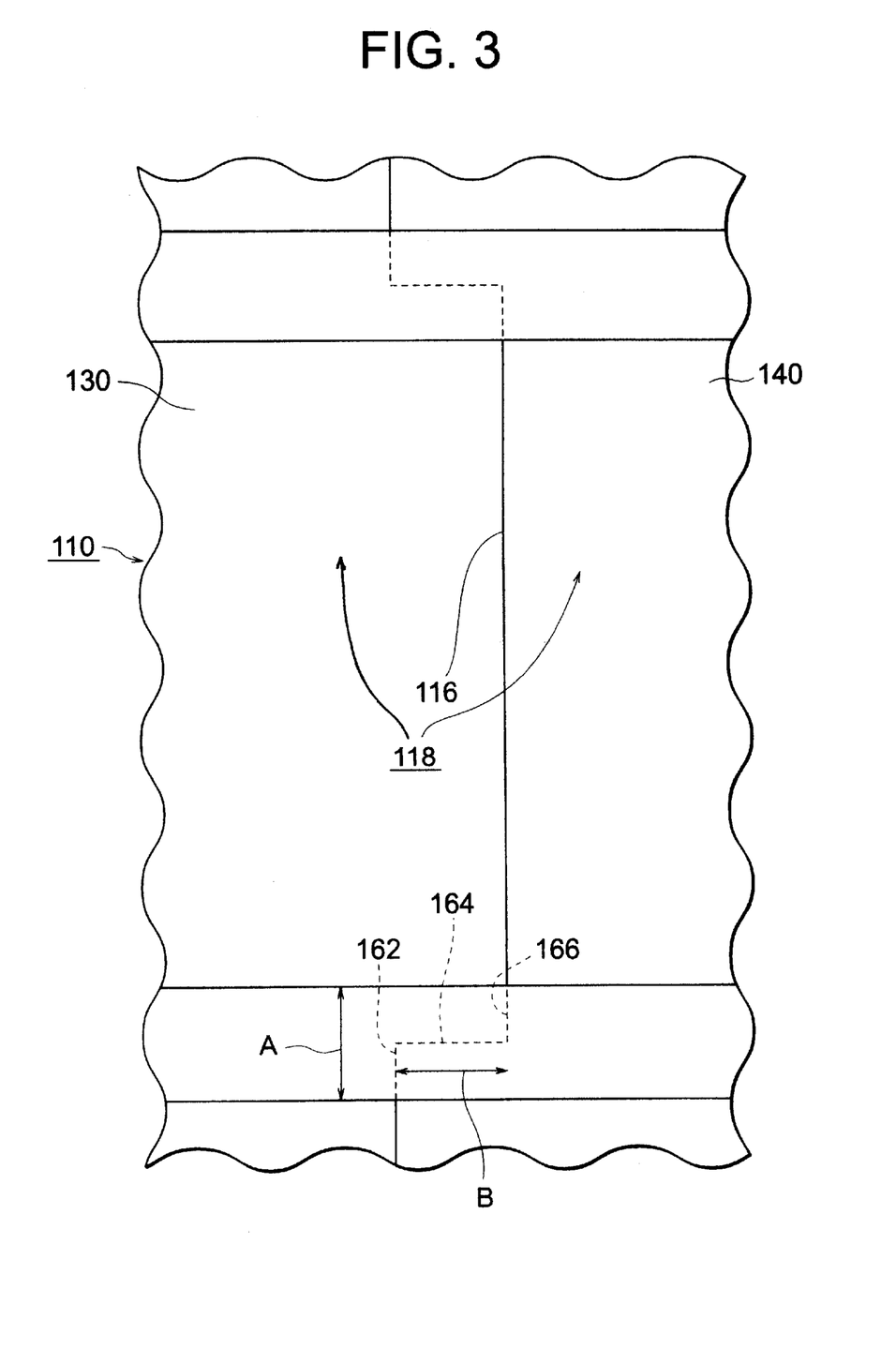
FIG. 3 is an enlarged plan view of part the device in FIG. 1.

Referring to FIG. 3, in passing over the vertical step 116, the interconnecting trace 154 passes over three segments: a first segment 162 oriented perpendicular to the edges of the interconnecting trace 154; a second segment 164 forming the horizontal side-step 117, oriented parallel to the edges of the interconnecting trace 154; and a third segment 166 oriented parallel to the first segment 162. The length B of the second segment 164 is preferably equal to or greater than the width A of the interconnecting trace 154. The total length (A+B) of the vertical step 116 crossed by the interconnecting trace 154 is then at least twice the width A of the interconnecting trace 154.

The LED array 100 operates by the flow of current from the bonding pad 152 to the contact portion 156, then through the light-emitting region 122 and semiconductor substrate 120 to the common electrode 160, light being generated as carriers recombine near the above-mentioned p-n junction. A detailed description will be omitted.

The effect of the horizontal side-step 117 is to increase the total length of the vertical step 116 crossed by the interconnecting trace 154 from A to A+B in FIG. 3. The increased length enhances the reliability of the LED array 100 by reducing the likelihood of an electrical discontinuity in the interconnecting trace 154 where it crosses the vertical step 116.

This effect is obtained with no increase in the width of the interconnecting trace 154. This feature of the invention is particularly important in LED arrays in which the interconnecting traces are closely spaced and their width cannot be increased.

Next, a fabrication process for the LED array 100 will be described. The process starts from a wafer of the material that forms the semiconductor substrate 120.

Figure 4:
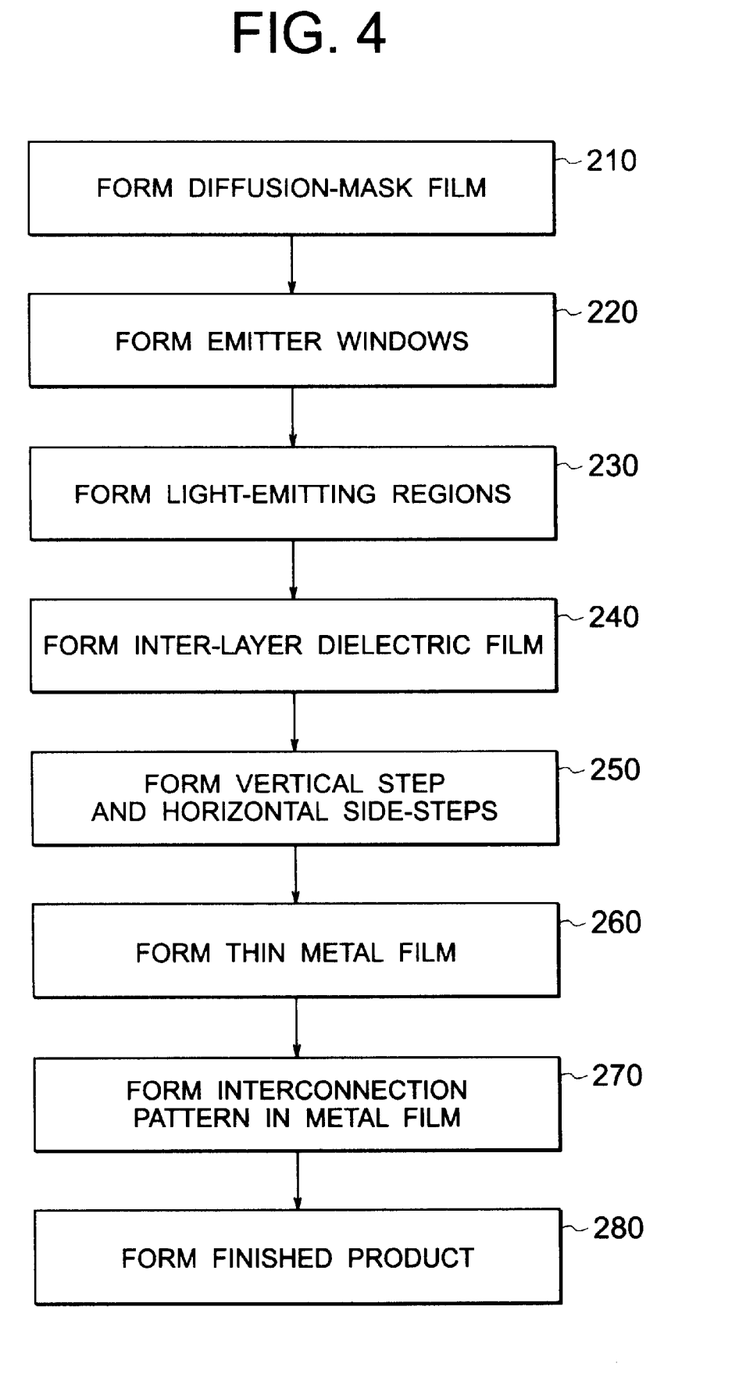
FIG. 4 is a flowchart of a fabrication process for the device in FIG. 1.

Referring to FIG. 4, the first step 210 is the creation of a film of diffusion-mask material on the entire surface of a wafer. For example, a film of $Al_2O_3/Si_3N_4$ is deposited by sputtering.

In the next step 220, this film is patterned by photolithography and etching to form the emitter windows 132. This completes the formation of the diffusion mask 130.

In the next step 230, impurity atoms are diffused through the emitter windows 132 into the semiconductor substrate 120 to form the light-emitting region 122 of each LED. Solid-phase diffusion can be employed, for example.

In the next step 240, a dielectric film is formed on the entire surface of the diffusion mask 130. For example, a layer of $Si_3N_4$ is deposited by sputtering.

In the next step 250, this dielectric film is patterned to expose the part of the diffusion mask 130 including the emitter windows 132. The remaining part of the dielectric film becomes the inter-layer dielectric film 140. This patterning process also creates the vertical step 116, including the horizontal side-steps 117. The patterning is carried out by dry etching with carbon tetrafluoride and oxygen ($CF_4$ + $O_2$), for example. The electrode formation surface 118 is now complete.

In the next step 260, a thin film of metal is deposited on the electrode formation surface 118. For example, a film of aluminum is deposited by electron-beam evaporation. The metal film adheres to almost the entire electrode formation surface 118, but as mentioned earlier, a small gap may be left between the metal film and the electrode formation surface 118 at the bottom of the vertical step 116.

Figure 5:
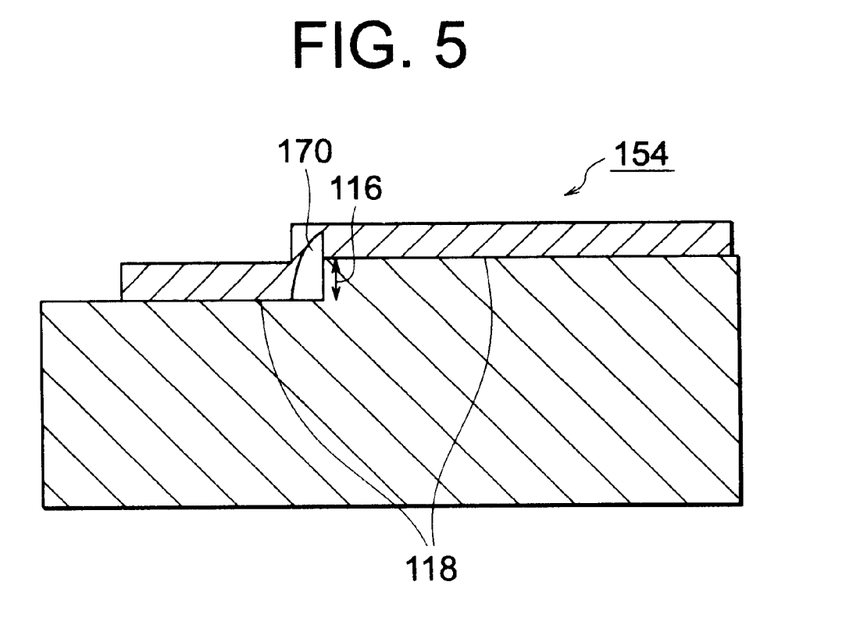
FIG. 5 is a sectional view of the device in FIG. 1, showing a section including an edge of the interconnection wiring.

In the next step 270, the metal film is patterned by photolithography and etching, for example, to form the metal interconnection pattern 150. During the etching step, as metal is removed at the edges of the interconnecting traces 154, the gaps between the metal film and the electrode formation surface 118 at the bottom of the first and third segments 162, 166 in FIG. 3 are exposed. Entering these gaps, the etchant may enlarge them into sizeable tunnels 170 as shown in FIG. 5. This undesired intrusion of etchant is impeded, however, at the corners between the first segment 162 and second segment 164, and between the second segment 164 and third segment 166. Relatively little etchant penetrates as far as the second segment 164. The interconnecting trace 154 thus remains substantially intact for the length B of the second segment 164.

In the last step 280 in FIG. 4, the common electrode 160 is formed; the wafer is diced into chips, each including an LED array 100; the chips are tested; mounting and wire bonding are performed; and various other processes are carried out as necessary to create a finished product.

During the lifetime of the product, joule heating and electromigration may augment the damage done by tunnel-etching to destroy the electrical continuity of the interconnecting trace 154 where it passes over the first segment 162 and second segment 164 in FIG. 3. This does not lead to device failure, however, because the interconnecting trace 154 remains substantially intact over the length B of the second segment 164.

Figure 6:
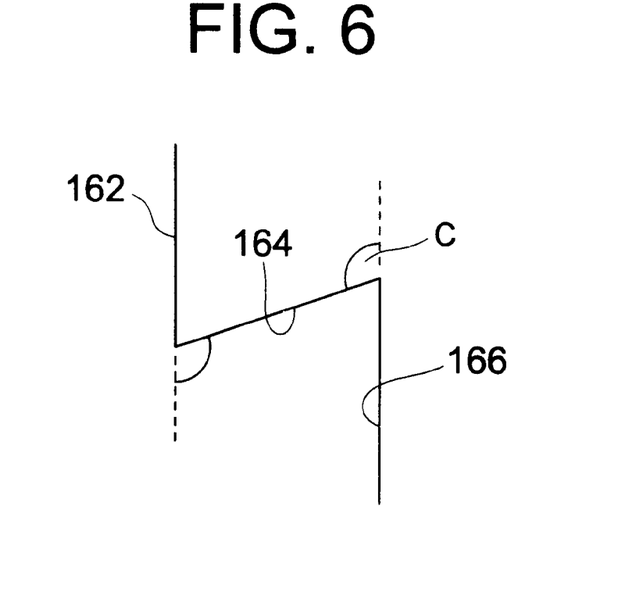
FIGS. 6 and 7 illustrate variations of the device in FIG. 1.
Figure 7:
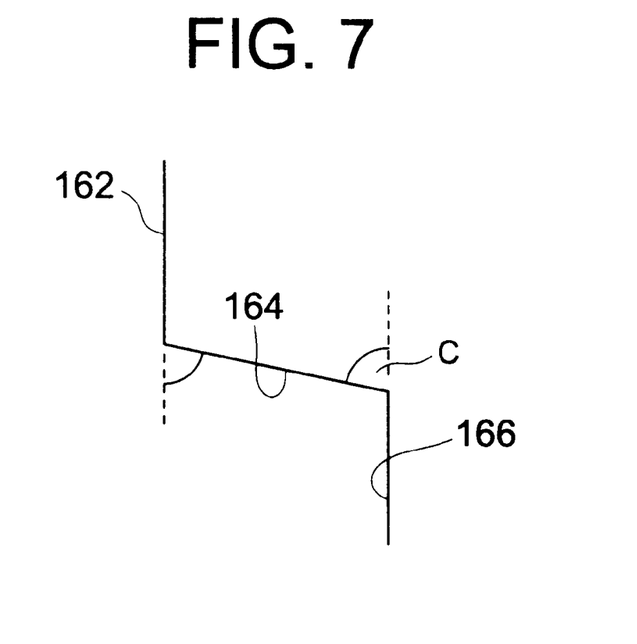

FIGS. 6 and 7 illustrate variations of the preceding embodiment in which the second segment 164 meets the first segment 162 and third segment 166 at angles C greater than and less than ninety degrees. The variation in FIG. 6, in which the angles C are greater than ninety degrees, is preferable to the variation in FIG. 7, because the variation in FIG. 6 lengthens the first segment 162 and second segment 164, making it even more difficult for etchant tunneling under the interconnection pattern 150 to reach the second segment 164.

Figure 8:
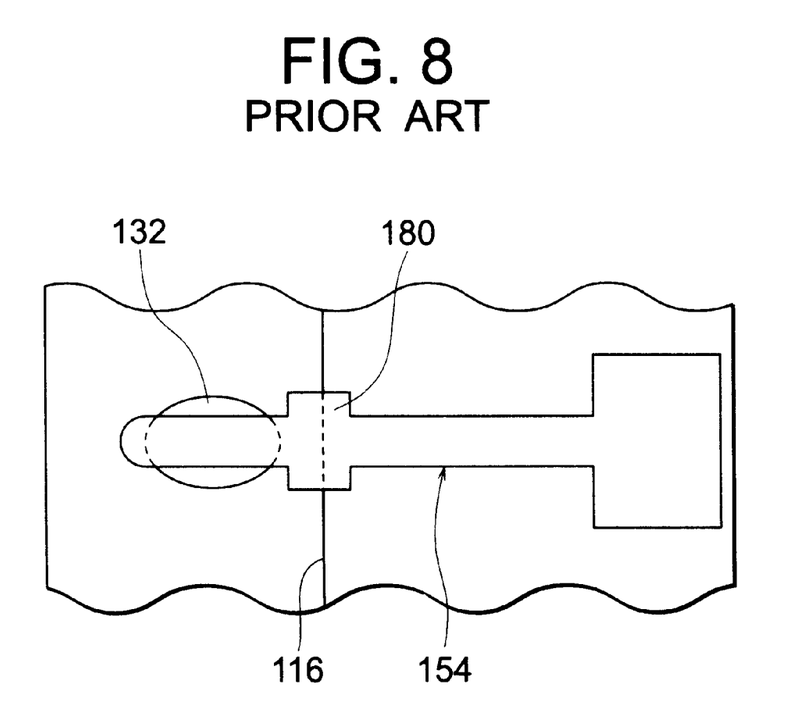
FIG. 8 illustrates a conventional device with a widened interconnection pattern.

FIG. 8 illustrates the conventional method of compensating for reduced step coverage by increasing the width of the interconnecting trace 154 where it crosses the vertical step 116. Aside from preventing the interconnecting traces from being closely spaced, however, the widened part 180 offers a wide reflecting wall that can reflect emitted light in unintended directions. In comparison, the horizontal side-step 117 in the invented device does not face the emitter window 132, so unwanted reflection is reduced.

The present invention is accordingly useful in raising manufacturing yields of LED arrays, improving their reliability, and avoiding optical reflection problems. It is particularly useful in fabricating LED arrays for high-resolution electrophotographic printers because, as noted above, the width of the interconnecting trace 154 is not increased, so the resolution of the array is not limited by step-coverage considerations.

The present invention does not preclude a widening of the interconnecting trace 154 as shown in FIG. 8, however. If the array resolution permits, and if reflection is not an issue, manufacturing yields and device reliability can be increased still further by providing both horizontal side-steps 117 in the vertical step 116 and a widening of the interconnecting traces where they pass over the vertical step 116.

The invention is not limited to the materials and junction types mentioned above. For example, the interconnection pattern is not limited to aluminum, but may be formed from copper or any other conductive material, and may be formed by sputtering or vacuum evaporation instead of electron-beam evaporation. In particular, sputtering may be preferable, as it tends to improve the step coverage by providing better adhesion to the substrate.

The diffusion-mask material ($Al_2O_3/Si_3N_4$) may be replaced with a mixture of aluminum nitride and silicon nitride ($AlN/Si_3N_4$), or a mixture of aluminum oxide and silicon dioxide ($Al_2O_3/SiO_2$). The inter-layer dielectric film may be formed from, for example, aluminum oxide or aluminum nitride. The diffusion mask and inter-layer dielectric film may be formed by various types of chemical vapor deposition (CVD), such as thermal-CVD, plasma-CVD, or photo-CVD, or by various epitaxial growth processes, such as liquid-phase epitaxy (LPE), solid-phase epitaxy (SPE), or molecular-beam epitaxy (MBE). The diffusion mask may also be formed by vacuum evaporation.

The substrate material (GaAsP) may be replaced by, for example, aluminum gallium arsenide phosphide (AlGaAsP), aluminum gallium arsenide (AlGaAs), or indium gallium arsenide phosphide (InGaAsP). The p-n homo-junction may be replaced by a p-n hetero-junction, or a p-i-n homo-junction or hetero-junction, and may be formed by vapor-phase diffusion or ion implantation instead of solid-phase diffusion.

In the fabrication flow illustrated in FIG. 4, the vertical step 116 and horizontal side-step 117 are formed in a single dry-etching process, but the formation of the vertical step and horizontal side-step may be broken down into two processes. For example, a straight vertical step may be formed by masking and etching, then further masking and etching may be carried out to create indentations in the straight vertical step, thereby creating horizontal side-steps.

Applications of the invention are not limited to LED arrays. It is anticipated that the invention will be useful in the fabrication of other types of opto-electronic devices, such as semiconductor lasers, optical amplifiers, photodiodes, and optical integrated circuits. The invention can also be used in the fabrication of metal-oxide-semiconductor field-effect transistors (MOSFETs), semiconductor memory devices, and other semiconductor integrated circuits having vertical steps in which horizontal side-steps can be formed by conventional methods such as photolithography and etching.

Those skilled in the art will recognize that further variations are possible within the scope claimed below.

What is claimed is:

1. A semiconductor device having an electrode formation surface with a step extending from an upper part of the electrode formation surface to a lower part of the electrode formation surface, and an interconnection pattern formed on the electrode formation surface, crossing the step, wherein:

the step includes at least a first part extending from the upper part of the electrode formation surface to the lower part of the electrode formation surface, a second part extending from the upper part of the electrode formation surface to the lower part of the electrode formation surface, and a third part extending from the upper part of the electrode formation surface to the lower part of the electrode formation surface, the first part being oriented in a first direction at an edge of the interconnection pattern, the second part being oriented in a second direction at another edge of the interconnection pattern, the third part being covered by the interconnection pattern and oriented in a third direction different from said first direction and said second direction, as seen looking from said upper part of the electrode formation surface to said lower part of the electrode formation surface.

2. The semiconductor device of claim 1, wherein the third part of the step has a length at least equal to a width of the interconnection pattern.

3. The semiconductor device of claim 1, wherein the third part of the step is oriented at angles of more than ninety degrees with respect to the first part of the step and the second part of the step.

4. The semiconductor device of claim 1, wherein the semiconductor device is an opto-electronic device.

5. A semiconductor device having an electrode formation surface with a vertical step, and an interconnection pattern formed on the electrode formation surface, crossing the vertical step, wherein:

the vertical step includes a horizontal side-step entirely covered by the interconnection pattern; and the horizontal side-step has a length at least equal to a width of the interconnection pattern.

6. The semiconductor device of claim 5, wherein the semiconductor device is an opto-electronic device.

7. A semiconductor device having an electrode formation surface with a vertical step, and an interconnection pattern formed on the electrode formation surface, crossing the vertical step, wherein:

the vertical step includes a horizontal side-step entirely covered by the interconnection pattern; and the horizontal side-step is disposed at an angle of more than ninety degrees to segments of he vertical step adjacent to the horizontal side-step.

8. The semiconductor device of claim 7, wherein the semiconductor device is an opto-electronic device.

* * * * *